United States Patent
Kabir et al.

(10) Patent No.: US 10,840,203 B2
(45) Date of Patent: Nov. 17, 2020

(54) ASSEMBLY PLATFORM

(71) Applicant: Smoltek AB, Gothenburg (SE)

(72) Inventors: M Shafiqul Kabir, Västra Frölunda (SE); Anders Johansson, Öckerö (SE); Vincent Desmaris, Gothenburg (SE); Muhammad Amin Saleem, Gothenburg (SE)

(73) Assignee: SMOLTEK AB, Gothenburg (SE)

( * ) Notice: Subject to any disclaimer, the term of this patent is extended or adjusted under 35 U.S.C. 154(b) by 0 days.

(21) Appl. No.: 16/094,595

(22) PCT Filed: May 3, 2017

(86) PCT No.: PCT/SE2017/050430
§ 371 (c)(1),
(2) Date: Oct. 18, 2018

(87) PCT Pub. No.: WO2017/192096
PCT Pub. Date: Nov. 9, 2017

(65) Prior Publication Data
US 2019/0267345 A1    Aug. 29, 2019

(30) Foreign Application Priority Data
May 6, 2016 (SE) .................... 1630103

(51) Int. Cl.
*H01L 23/00* (2006.01)
*H01L 21/48* (2006.01)
(Continued)

(52) U.S. Cl.
CPC ......... *H01L 24/16* (2013.01); *H01L 21/4853* (2013.01); *H01L 23/3128* (2013.01);
(Continued)

(58) Field of Classification Search
CPC . H01L 51/56; H01L 51/5253; H01L 51/5056; H01L 51/0072; C09K 11/06
(Continued)

(56) References Cited

U.S. PATENT DOCUMENTS 6,281,042 B1    8/2001   Ahn et al.
7,371,674 B2    5/2008   Suh et al.
(Continued)

FOREIGN PATENT DOCUMENTS

EP    1 976 041       1/2008
JP    2005-109465     4/2005
(Continued)

OTHER PUBLICATIONS

Supplementary European Search Report from EP 17792957, dated Nov. 13, 2019.
(Continued)

*Primary Examiner* — Andy Huynh
(74) *Attorney, Agent, or Firm* — Westman, Champlin & Koehler, P.A.

(57) ABSTRACT

An assembly platform for arrangement as an interposer device between an integrated circuit and a substrate to interconnect the integrated circuit and the substrate through the assembly platform, the assembly platform comprising: an assembly substrate; a plurality of conducting vias extending through the assembly substrate; at least one nanostructure connection bump on a first side of the assembly substrate, the nanostructure connection bump being conductively connected to the vias and defining connection locations for connection with at least one of the integrated circuit and the substrate, wherein each of the nanostructure connection bumps comprises: a plurality of elongated conductive nanostructures vertically grown on the first side of the assembly substrate, wherein the plurality of elongated
(Continued)

nanostructures are embedded in a metal for the connection with at least one of the integrated circuit and the substrate, at least one connection bump on a second side of the assembly substrate, the second side being opposite to the first side, the connection bump being conductively connected to the vias and defining connection locations for connection with at least one of the integrated circuit and the substrate.

30 Claims, 8 Drawing Sheets

(51) Int. Cl.
  *H01L 23/31* (2006.01)
  *H01L 23/498* (2006.01)
(52) U.S. Cl.
  CPC .. *H01L 23/49816* (2013.01); *H01L 23/49838* (2013.01); *H01L 23/49827* (2013.01); *H01L 2224/10165* (2013.01); *H01L 2224/16238* (2013.01)
(58) Field of Classification Search
  USPC ........................................................ 257/668
  See application file for complete search history.

(56) References Cited

U.S. PATENT DOCUMENTS

| | | |
|---|---|---|
| 8,749,979 B2 | 6/2014 | Iwai et al. |
| 2004/0233649 A1 | 11/2004 | Honlein et al. |
| 2005/0215049 A1 | 9/2005 | Horibe et al. |
| 2008/0224327 A1 | 9/2008 | Suh et al. |
| 2008/0274592 A1 | 11/2008 | Lee et al. |
| 2010/0237483 A1 | 9/2010 | Chi et al. |
| 2011/0039459 A1 | 2/2011 | Yancey |
| 2011/0285023 A1* | 11/2011 | Shen ........................ H01L 24/03 257/773 |
| 2014/0175665 A1* | 6/2014 | Kang .................... H01L 23/481 257/774 |
| 2016/0111380 A1* | 4/2016 | Sundaram ............. H01L 23/562 257/774 |

FOREIGN PATENT DOCUMENTS

| | | |
|---|---|---|
| JP | 2008-210954 | 9/2008 |
| TW | 200629511 | 8/2006 |
| TW | 200736157 | 10/2007 |
| TW | 200951210 | 12/2009 |
| TW | 201615074 | 4/2016 |
| WO | WO 2006/048846 | 5/2006 |
| WO | WO 2007/078627 | 7/2007 |
| WO | WO 2010/090055 | 8/2010 |
| WO | 2015/069184 | 5/2015 |

OTHER PUBLICATIONS

International Search Report and Written Opinion from PCT/SE2017/050430, dated Aug. 25, 2017.

Office Action from Taiwan (R.O.C.) Application No. 106114801, including Search Report, dated May 21, 2020.

Office Action from Taiwanese Application No. 10920813520, dated Aug. 26, 2020.

\* cited by examiner

ASSEMBLY PLATFORM

CROSS-REFERENCE TO RELATED APPLICATION

This Application is a Section 371 National Stage Application of International Application No. PCT/SE2017/050430, filed May 3, 2017 and published as WO 2017/192096 on Nov. 9, 2017, in English, which claims the benefit of priority of Swedish Application No. 1630103-8, filed on May 6, 2016, the entire contents of which are hereby incorporated by reference in their entirety.

FIELD OF THE INVENTION

The present invention relates to an assembly platform for arrangement between an electronic device and a substrate to interconnect the first electronic device and the substrate through the assembly platform. The present invention also relates to a method of manufacturing such an assembly platform.

BACKGROUND OF THE INVENTION

In today's electronics, size and form factors are of significant consideration in any physical arrangement of chips. Due to the rapid progress in portable electronic devices the demand for more compact physical arrangements of chips has become even more intense resulting in demand of improving the technology around electronic packaging solutions. As an example, today's phone is equipped with devices including powerful processors, memory, sensors, transceivers etc. to make it to a smart system. To make such a smart system demands very high integration possibilities (including heterogeneous integrations) to package many functional chips into a very small space or more suitably called overall small foot print. Many of these functional chips require densely packed input and output connections, commonly known as I/Os. These I/Os typically need to be connected to other chips or a PCB board underneath to complete the total functional system. Furthermore, to make efficient I/Os, they are required to be as small as possible to increase the number of I/O points per unit area, increase the electrical and mechanical reliability at a small size, reduce the overall resistance and impedance of the interconnects and hence to minimize the signal propagation delays.

Interposers emerged a packaging platform serving as a high density I/O substrate with a redistribution layers. It also allows a heterogeneous assembly of incompatible technologies to be mixed on the same platform and combined with Through Silicon Vias (TSVs), opens the doors for further optimization of form factors. In order to electrically connect devices through the interposer TSVs, the interposer typically has a number of solder balls which are arranged to match the I/Os on the devices (e.g. the IC and a connecting substrate).

However, the potential of the today's conventional interposers faces the limitations on the number of devices that can be connected. For example, the interposer may limit the form factor and/or the performance of a final electronic device since the number of components that can be interconnected is primarily limited by the interposer solder balls and its limitations in terms of size, pitch (a typical conventional pitch may be about 50 µm) and height. Furthermore, the ever increasing demand for more functions per unit area of a chip creates the demand to go down in dimension of the solder balls in terms of interconnect pitch to enable higher number of I/O points per unit area. The conventional interposers are relatively 'unsmart' which do not allow anything more than the interconnects and routing paths. The I/O points or pillars made by the conventional technology also possess challenges to further miniaturize the I/O dimensions and increases the poor reliability issues and fatigue failures. Thus, there is a need for improved connection interfaces with freedom to decrease the dimensions in x, y and z, such as an advanced interposers, for electronic devices. This leads to the need for an advanced wafer level packaging platform that can unleash the freedom to design further miniaturization of the packaging of functional chips and components to a smarter and slick assembly platform.

Accordingly, todays conventional interposers pose a limitation on the number devices that can be connected due to the arrangement of the solder balls or the metallic materials that creates the connection. This may lead to that the interposer may limit the performance of a final electronic device since the number of components that can be interconnected is set by the interposer solder ball and its limitations. Furthermore, the ever increasing demand for more functions per unit area of a chip creates the demand to go down in dimension of the solder balls in terms of interconnect pitch to enable more number of I/O points per unit area.

Thus, there is a need for improved connection interfaces, such as interposers, for electronic devices.

SUMMARY

In view of the above-mentioned and other drawbacks of the prior art, it is an object of the present invention to provide an assembly platform which alleviates at least some of the above drawbacks of the prior art.

According to a first aspect of the present invention, it is therefore provided an assembly platform for arrangement as an interposer device between an integrated circuit and a substrate to interconnect the integrated circuit and the substrate through the assembly platform, the assembly platform comprising: an assembly substrate; a plurality of conducting vias extending through the assembly substrate; at least one nanostructure connection bump on a first side of the assembly substrate, each nanostructure connection bump being conductively connected to at least one of said vias and defining a connection location for connection with at least one of the integrated circuit and the substrate, wherein each of the nanostructure connection bumps comprises: a plurality of elongated conductive nanostructures vertically grown on the first side of the assembly substrate, wherein the plurality of elongated nanostructures are embedded in a metal for the connection with at least one of the integrated circuit and the substrate, an electrode connected to each nanostructure in the first plurality of nanostructures and connected to the vias, at least one connection bump on a second side of the assembly substrate, the second side being opposite to the first side, the connection bump being conductively connected to the vias and defining connection locations for connection with at least one of the integrated circuit and the substrate.

The conductive vias may be conductively connected to the nanostructures, so that electrical current can flow from the nanostructures to the vias. Moreover, the assembly substrate may advantageously be an insulating substrate. The electrode is conductively connected to the nanostructures, so that electrical current can flow from the nanostructures to the electrode.

The term "nanostructure connection bump" is not meant to mean that the connection bump itself has to be nano-sized, but is meant to mean that the connection bump comprises nanostructures. The present invention is based upon the realization that an assembly platform can conveniently be provided using nanostructures embedded in a metal as nanostructure connection bumps. By growing the nanostructures on the assembly substrate, the pitch, i.e. the distance between the nanostructure connection bumps can be considerably reduced compared to conventional connection bumps, thereby enabling more input/output points on an assembly platform (i.e. the density of I/O's can be increased). Additionally, the height of the assembly platform as an interposer in the direction of the interconnected devices (i.e. IC and substrate) can be reduced compared to conventional interposers, thereby reducing the size of the complete electronic assembly. Furthermore, the assembly platform can be processed at higher temperatures than typical integrated circuits, allowing larger thermal budget window and thereby more freedom in the configuration of the nanostructures and/or a more cost-efficient processing. In addition, manufacturing of the assembly platform is significantly simplified by growing the nanostructures on the assembly substrate since the nanostructures do not have to be e.g. transferred or otherwise additionally processed. A further advantage is that the interface strength/properties between the nanostructures and the underlying substrate is improved by growing the nanostructures directly on the substrate or on the electrode. Another additional advantage to grow the nanostructures directly on the assembly substrate or on the electrode present on the substrate is that the growth processing parameters for growing nanostructures do not need to comply with the traditional CMOS or other chip processing environments open up new possibilities. Furthermore, growth processing parameters can be tailored to grow nanostructures with different properties. This can enable to exploit the electrical, mechanical, optical or any other properties of grown nanostructures to benefit the assembly platform.

The use of grown nanostructures allows extensive tailoring of the properties of the nanostructures. For instance, the height of the assembly platform may be controlled by tailoring the growing height of the nanostructures. Such advantage essentially may unleash the control of the size of a nanostructure bumps to be controlled in all x, y and z directions.

The nanostructures preferably provide metallic conduction properties for the nanostructure connection bumps. The nanostructures may advantageously be carbon nanostructures, such as carbon nanotubes, carbon nanofibers, or carbide-derived carbon nanostructures. Additionally or alternatively, the nanostructures may advantageously be metallic nanostructures. The elongated nanostructures may be in the form of nanowires, nanowhiskers, or nanotubes.

That the nanostructures are grown on the substrate should be interpreted as that the nanostructures may be grown directly on the substrate or on an electrode arranged on the substrate. The electrode is deposited on the assembly substrate prior to growing the nanostructures. Thus, according to various embodiments, the electrode may be arranged between the assembly substrate and each nanostructure in the first plurality of conductive nanostructures. In these embodiments, the nanostructures in the first plurality of nanostructures may be grown from the electrode on the substrate, that is, from a conductive electrode on the substrate. In short, the nanostructures may be grown from the electrode which is arranged on the substrate.

According to embodiments, the assembly platform may further comprise a conductor pattern on the assembly substrate, the conductor pattern being conductively connected to the vias and configured to connect the nanostructure connection bump to the vias so that the nanostructure connection bump is electrically connected to the connection bump on the second side of the assembly substrate.

In a further embodiment, the electrode is part of the conductor pattern.

According to embodiments, the plurality of elongated nanostructures of the nanostructure connection bump and the amount of metal may be configured so that the metal is maintained within the connection location by the plurality of elongated nanostructures. The nanostructures may thus be arranged to cause capillary forces that prevent the metal from escaping away from the connection location defined by the nanostructure connection bump. The escaping may for example be prevented at times when the assembly platform is bonded to the IC or the substrate. At such times the metal of the connection bump may be in liquid state. The capillary force may further contribute to obtain a connection bump with fewer voids. In addition, the presence of nanostructures may also enable to reduce the amount of metals needed to create the connection bump joining.

According to an embodiment, the plurality of elongated nanostructures of said nanostructure connection bump are densely arranged such that the metal when in a liquid state is maintained within the connection location by capillary forces caused by said plurality of elongated nanostructures.

According to another embodiment, the pitch between two adjacent nanostructure connection bumps on the first side is different from the pitch between two adjacent connection bumps on the second side, each of the two nanostructure connection bumps on the first side are connected to a respective adjacent connection bump on the second side through a respective vias. In other words, the assembly platform may be arranged to provide a fan-out of the connection bumps from the one side to another side. In this embodiment, a first nanostructure connection bump on the first side is interconnected with a first connection bump on the second side, and a second nanostructure connection bump on the first side is interconnected with a second connection bump on the second side, where the pitch on the first side is different from the pitch on the second side.

In one embodiment, the pitch between two adjacent nanostructure connection bumps on the first side is smaller than the pitch between two adjacent connection bumps on the second side.

According to an embodiment, the at least one connection bump on the second side of the assembly substrate is/are nanostructure connection bump(s). In other words, the connection bumps on the second side of the assembly substrate may be nanostructure connection bumps and thus comprise nanostructures.

According to embodiments, the height of the nanostructure connection bump may be controllable by the growing height of the elongated conductive nanostructures.

According to embodiments, the assembly platform may further comprise a second plurality of elongated nanostructures vertically grown on the first side of the assembly substrate. The second plurality of elongated nanostructures may be configured to other functions than the first plurality of nanostructures. The second plurality of nanostructures may be configured to dissipate heat from the IC to the assembly substrate thereby serving to improve thermal dissipation of e.g. an electronic assembly comprising the second plurality of elongated nanostructures. The second plurality of nanostructures may be configured to mechanically support the IC to thereby relieve stress on the nanostructure connection bumps exerted by e.g. the IC. The second plurality of nanostructures may be configured to reduce mismatch in coefficient of thermal expansion. Thus, the nanostructures flexes as a response to thermal expansion of e.g. the IC or substrate so that there is some degree of mismatch tolerance. The second plurality of nanostructures may be arranged as alignment marks or have optical functions (e.g. light absorbing black materials, frequency dependent/sensitive element). The second plurality of nanostructures may be arranged in a regular array to create structures to mimic artificial photonic crystals to function as optical interconnects or wave guides. To make a functional second plurality of nanostructures they may be designed to grown anywhere on the interposer according to embodiment design and functions.

According to an embodiment of the invention, the second plurality of nanostructures may be grown in an opening in the assembly structure, whereby the second plurality of nanostructures extend from a bottom part of the opening to above the surface of the first side of the assembly substrate. The opening may be in the form or a recess in the substrate.

In yet another embodiment, the assembly platform may further comprise a second plurality of elongated nanostructures vertically grown on said second side of said assembly substrate.

Also in the case of the second plurality of nanostructures being grown on the second side, the second plurality of nanostructures may have been grown in an opening in said assembly structure, whereby the second plurality of nanostructures extend from a bottom part of said opening to above the surface of the second side of the assembly substrate.

The advantages of having the second plurality of nanostructures on the second side are similar to the above mentioned advantages of having the second plurality of nanostructures on the first side.

Furthermore, the second plurality of nanostructures may be coated with or embedded in metal or a polymer regardless of which side they have been grown. A coating should be understood as a conformal layer or at least nearly conformal layer of the coating material on the nanostructures.

In another aspect of the present invention, the second plurality of nanostructures may be grown on a metal layer(s) and may be coated with a conformal or non-conformal layer of film of polymer or dielectric or electrolyte materials. In some embodiments another layer of metal is added to the nanostructures for improved conductivity as a coating before the film of polymer or dielectric or electrolyte materials is added. The coated film on the second plurality of nanostructures may further be coated with an additional layer of metal film to form a metal-nanostructure-dielectric/electrolyte-metal configuration. In such configuration, the electrolyte may be in the form of solid state electrolyte or in the form of sol-gel electrolyte. Such a metal-nanostructure-dielectric/electrolyte-metal configuration may be connected with other parts of the assembly platform via metal lines through the bottom most and top most metal layer of the metal-nanostructure-dielectric/electrolyte-metal configuration. This way second plurality of nanostructures may provide to form a functional local energy storage device(s) or capacitor(s) on the assembly platform.

According to an embodiment of the invention, the second plurality of nanostructures may be grown surrounding the at least one nanostructure connection bump. In other words, the second plurality of nanostructures may be arranged in around the periphery of the nanostructure connection bump. This way the second plurality of nanostructures may provide improved mechanical support between the assembly substrate and/or an IC.

According to an embodiment of the invention, the second plurality of nanostructures may be grown from a recessed assembly structure.

According to a second aspect of the present invention, there is provided an electronic assembly comprising an assembly platform according to any one of the embodiments, and further comprising the integrated circuit and the substrate and/or a second integrated circuit, wherein the integrated circuit and the substrate and/or the second integrated circuit are interconnected through the assembly platform.

In one embodiment, the electronic assembly may further comprise a protective polymer plastic based housing, wherein the assembly platform, the integrated circuit and the substrate is over-molded by the housing. This way, the integrated circuits and other electrical components of the electronic assembly is protected from e.g. humidity, sun light, dust, etc. or any other external environment not suitable for integrated circuits. The housing may be comprised of epoxy or a resin.

Further embodiments of, and effects obtained through this second aspect of the present invention are largely analogous to those described above for the first aspect of the invention.

According to a third aspect of the invention, there is provided a method of manufacturing an assembly platform for arrangement between an integrated circuit and a substrate to interconnect the first integrated circuit and the substrate through the assembly platform, the method comprising the steps of: providing an assembly substrate having a plurality of conducting vias extending through the assembly substrate, forming at least a first plurality of conductive elongated nanostructures on the assembly substrate; embedding each nanostructure in the first plurality of conductive nanostructures in a metal, whereby the first plurality of conductive elongated nanostructures and the metal forms a nanostructure connection bump being conductively connected to the vias and defining connection locations for connection with at least one of the integrated circuit and the substrate; forming a connection bump comprising a metal on a second side of the assembly substrate, the second side being opposite to the first side, the connection bump being conductively connected to the vias and defining connection locations for connection with at least one of the integrated circuit and the substrate.

This is further provided that there may be provided insulating layer(s) where necessary to create insulations between the layers where appropriate from processing point of view such that the connections function as interconnects. This is further provided that there may be provided diffusion barrier(s) for vias to avoid any diffusion of via materials to the substrate.

According to an embodiment of the invention, the step of forming the at least first plurality of conductive elongated nanostructures may comprise the steps of: providing a patterned catalyst layer on the assembly substrate; and growing each nanostructure in the first plurality of conductive nanostructures from the catalyst layer.

According to an embodiment of the invention, the step of forming the at least first plurality of conductive elongated nanostructures may comprise the steps of: providing a patterned catalyst layer on the assembly substrate; and growing each nanostructure in the first plurality of conductive nanostructures from the catalyst layer, wherein part of the catalyst layer maybe interdiffused in the nanostructures. Thus, at least part of the catalyst may be present in the nanostructures.

According to an embodiment of the invention, the step of forming the at least first plurality of conductive elongated nanostructures may comprise: depositing a conducting helplayer on an upper surface of a substrate; depositing a patterned layer of catalyst on the conducting helplayer; growing the one or more nanostructures on the layer of catalyst; and selectively removing the conducting helplayer between and around the one or more nanostructures.

According to an embodiment of the invention, the helplayer is a non-conducting helplayer.

According to an embodiment of the invention, wherein the layer of catalyst is patterned after it is deposited.

In one embodiment, the assembly substrate additionally may comprise a metal underlayer, co-extensive with its upper surface, and which is covered by the conducting helplayer.

Growing a plurality of nanostructures may be carried out using a method comprising: depositing a catalyst layer on the electrodes, the catalyst layer comprising grains having an average grain size different from the average grain size of the electrodes, thereby forming a stack of layers comprising the bottom layer and the catalyst layer; heating the stack of layers to a temperature where nanostructures can form and providing a gas comprising a reactant such that the reactant comes into contact with the catalyst layer.

The catalyst layer may be provided in any suitable manner such as deposition, sputtering, electroforming, ALD, CVD, electroless plating etc. or any other suitable method available for processing or depositing catalyst materials. Catalyst layer may be provide in the form of catalyst particles through spin coating or spray coating of catalyst particles. Catalyst particles may be single metal particle or maybe polymer coated metal particles or maybe bimetallic particles as suited to grow nanostructures.

In one embodiment the step of embedding the metal material may comprise: applying heat or pressure or combination of heat and pressure so that the metal liquefies; and solidifying the metal when in contact with the nanostructures, such that the plurality of nanostructures is embedded by said metal.

In one embodiment, the liquefied metal may be brought into the plurality of nanostructures by capillary forces caused by the plurality of nanostructures.

It should be noted that the steps of the method according to various embodiments of the present invention need not necessarily be carried out in any particular order.

The electrodes or conductive pattern may be provided in any suitable manner, such as through photo-lithography, sputtering, evaporation, electroforming, ALD, CVD, electroforming, electroless plating etc. or any other suitable method available for processing or depositing conductive materials.

Further embodiments of, and effects obtained through this third aspect of the present invention are largely analogous to those described above for the first aspect and the second aspect of the invention.

There is further provided an electronic assembly comprising an assembly platform according to any one of the embodiments, and further comprising chips containing integrated circuit, discrete components (e.g. resistor, capacitor, supercapacitor, energy storage element, inductor etc.) and the substrate, wherein the integrated circuit and the substrate are interconnected through the assembly platform wherein the integrated circuit maybe any one of ASIC, memory component, FPGA, µ-controller, CPU, GPU, transceiver, sensors, RFID etc., or any combination of them to create a functional system. In another aspect such assembled system is then suitable for computer programmed or reprogrammed using programming language via an external programming tools to make the system functional suitable for specific application.

There is further provided an assembly platform for arrangement as an interposer device between an integrated circuit and a substrate to interconnect the integrated circuit and the substrate through the assembly platform, the assembly platform comprising: an assembly substrate; a plurality of conducting vias extending through the assembly substrate; at least one nanostructure connection bump on a first side of the assembly substrate, each nanostructure connection bump being conductively connected to at least one of said vias and defining a connection location for connection with at least one of the integrated circuit and the substrate, wherein each of the nanostructure connection bumps comprises: a plurality of elongated conductive nanostructures vertically grown on the first side of the assembly substrate, a electrode connected to each nanostructure in the first plurality of nanostructures and connected to the vias; and at least one connection bump on a second side of the assembly substrate, the second side being opposite to the first side, the connection bump being conductively connected to the vias and defining connection locations for connection with at least one of the integrated circuit and the substrate.

There is further provided an assembly platform for arrangement as an interposer device between an integrated circuit and a substrate to interconnect the integrated circuit and the substrate through the assembly platform, the assembly platform comprising: an assembly substrate; a plurality of conducting vias extending through the assembly substrate; at least one nanostructure connection bump on a first side of the assembly substrate, each nanostructure connection bump being conductively connected to at least one of said vias and defining a connection location for connection with at least one of the integrated circuit and the substrate, wherein each of the nanostructure connection bumps comprises: a plurality of elongated conductive nanostructures vertically grown on the first side of the assembly substrate, a electrode connected to each nanostructure in the first plurality of nanostructures and connected to the vias; and at least one nanostructure connection bump on a second side of the assembly substrate, the second side being opposite to the first side, the nanostructure connection bump being conductively connected to the vias and defining connection locations for connection with at least one of the integrated circuit and the substrate.

This is further provided that there may be provided insulating layer(s) where necessary to create insulations between the layers where appropriate from processing point of view such that the connections function as interconnects.

This is further provided that there may be provided diffusion barrier(s) for vias to avoid any diffusion of via materials to the substrate.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

In the present detailed description, various embodiments of the assembly platform is mainly described with reference to an assembly platform being arranged as an interposer device between an integrated circuit and a substrate. However, it should be noted that this by no means limits the scope of the present invention, which equally well includes that the assembly platform may be arranged to interconnect any two types of electrical components, e.g. a die, silicon chips, integrated circuits, analog and/or digital circuits etc. Such an assembly platform may enable to have heterogeneous integration possibilities.

Figure 1:
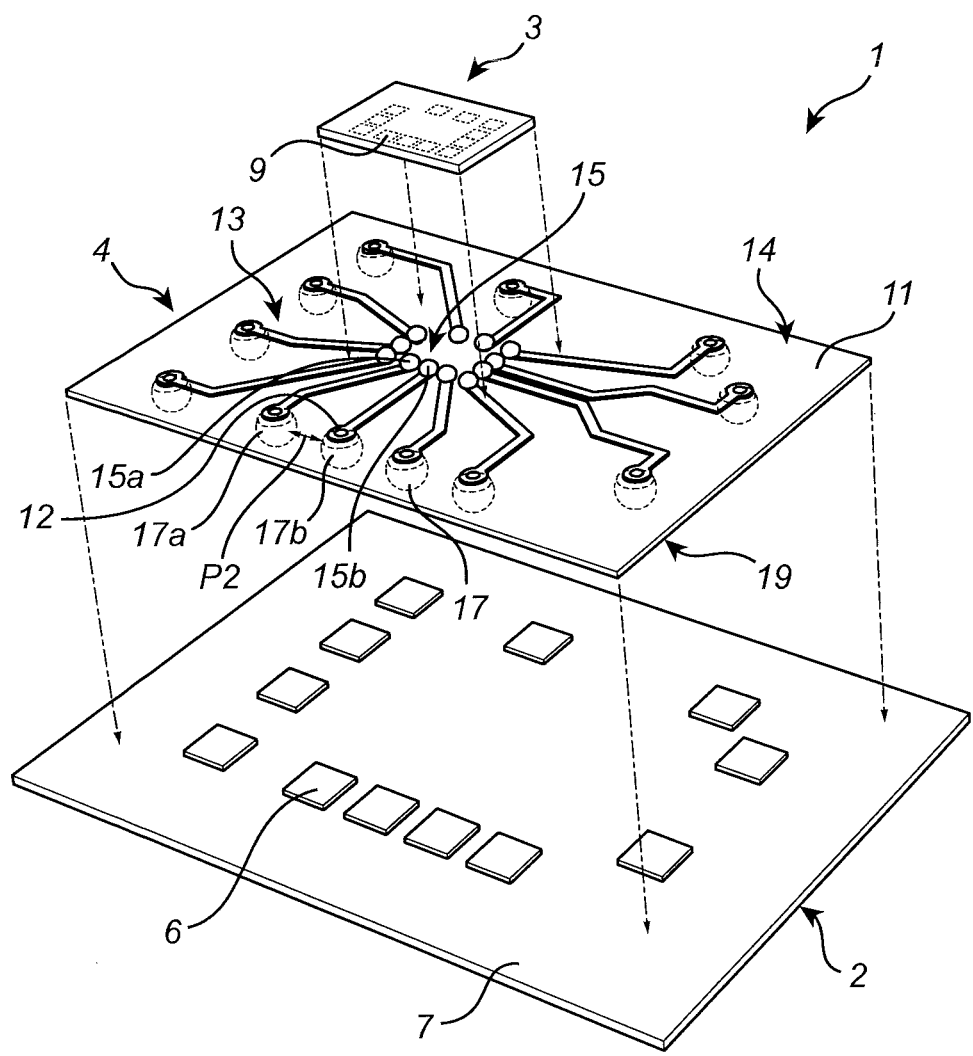
FIG. 1 schematically illustrates an electronic assembly comprising an assembly platform according to an example embodiment of the present invention.

FIG. 1 schematically illustrates an electronic assembly 1 comprising a substrate, here in the form of a simplified printed circuit board (PCB) 2, an integrated circuit (IC) 3, and an assembly platform 4 arranaed as an interposer device according to an example embodiment of the present invention. The PCB includes PCB connection pads 6 formed on a PCB-substrate 7, and the IC 3 includes IC connection pads 9. As is schematically indicated in FIG. 1, the spacing between the IC connection pads 9 is considerably smaller than the spacing between the PCB connection pads 6. The assembly platform 4 in FIG. 1 comprises an assembly substrate 11, a plurality of vias 12 extending through the assembly substrate 11, and a conductor pattern 13.

The conductor pattern 13 is conductively connected to the vias 12 and to nanostructure connection bumps 15 on the first side 14 of the assembly substrate 11. The conductor pattern may generally be refer to as a redistribution layer (RDL). The nanostructure connection bumps 15 are configured to define connection locations for connection with the IC 3 in this exemplary embodiment. On the second side 19 of the assembly platform 4, opposite from the first side 14, there are connection bumps 17 conductively connected to the vias 12 and defining connection locations for the PCB 2. In other words, conductors 13 extend from a first set of bumps being nanostructure connection bumps 15 for connection to the IC connection pads 9 to the vias 12, with the vias here being directly connected through the assembly substrate 11 with a second set of connection bumps 17 for connection to the PCB connection pads 6. The second set of bumps 17 may be nanostructure connection bumps or conventional connection bumps, e.g. metal bumps.

The nanostructure connection bumps 15 each comprises a plurality of elongated conductive nanostructures 25 vertically grown on the first side of the assembly substrate and a metal embedding the nanostructures. These structures are not explicitly shown in FIG. 1, but will be described in greater detail below with reference to FIG. 2a to FIG. 4b, and in FIG. 11.

It should be noted that the printed circuit board 2 may be replaced with another assembly platform 4, i.e. several assembly platforms may be stacked if required by the specific application.

Figure 2A:
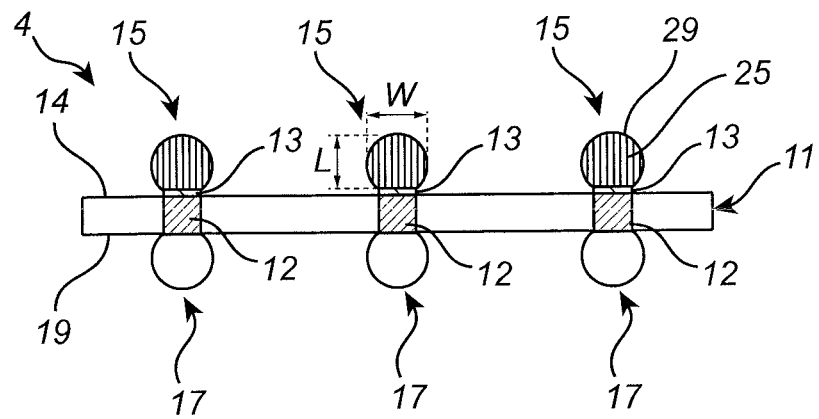
FIGS. 2a to 4e schematically illustrate different embodiments of the assembly platform in FIG. 1.
Figure 2B:
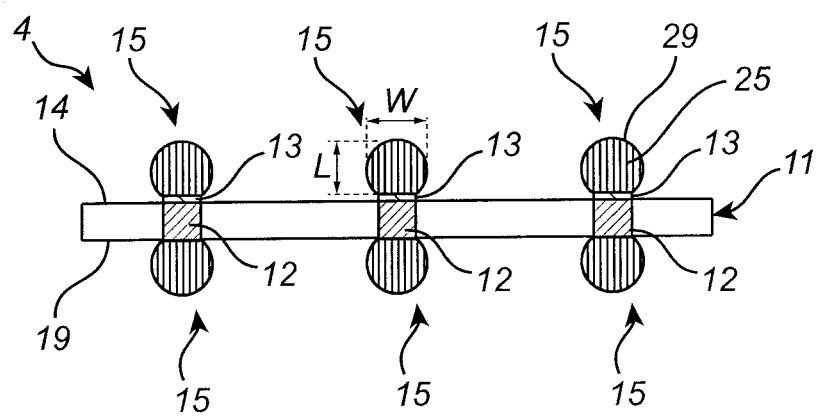

FIG. 2a is a schematic cross-section of at least part of an assembly platform 4 according to an embodiment of the invention. In FIG. 2a there is shown an assembly substrate 11 having a plurality of vias' 12 extending through the assembly substrate 11, from the first side 14 to the second side 19 of the assembly substrate 11. There is also shown a conductor pattern 13 conductively connected to the vias' 12. The conductor pattern may comprise electrodes, but in this embodiment the electrodes are part of the conductor pattern 13. On the first side 14 of the substrate 11, there is a plurality of nanostructures 25 embedded in a metal 29, together forming a nanostructure connection bump 15. The nanostructure connection bumps 15 define the connection location for connection with e.g. the IC 3. The conductive nanostructures 25 are elongated nanostructures vertically grown on the first side 11 of the assembly substrate 11. In one embodiment the conductive nanostructures 25 are carbon nanostructures. In another embodiment the nanostructures are metallic nanostructures, e.g. nanotubes, nanofibers, nanowhiskers or nanowires. On the second side 19 of the interposer substrate 11 there is connection bumps 17 also connected with the vias 12. The connection bumps 17 on the second side 19 define connection points for e.g. a PCB 2. The connection bumps 17 on the second side 19 may be made from a metal without the nanostructures as schematically illustrated in FIG. 2a, or alternatively the connection bumps 17 on the second side 19 may be nanostructure connection bumps as the ones on the first side 11 as is illustrated in FIG. 2b. The only difference between FIG. 2a and FIG. 2b being that the connection bumps on the second side 19 in FIG. 2b are nanostructure connection bumps 15 instead of metal connection bumps 17 not having embedded nanostructures. Furthermore, a combination of metal connection bumps and nanostructure connection bumps is also possible.

Figure 3:
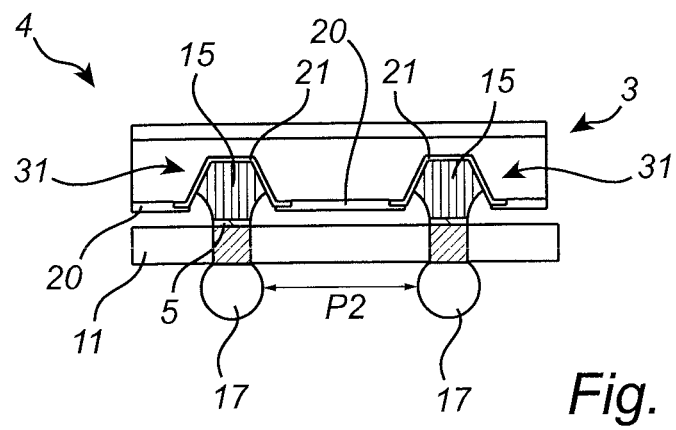

Referring to FIG. 3, there is schematically shown an assembly platform 4 assembled with an IC 3. The assembly platform 4 may the one shown in FIG. 2a. The IC 3 comprises connection terminals 31 to which the nanostructure connection bumps 15 are connected by applying heat or pressure or combination of the two as appropriate to the metal of the nanostructure connection bump so melting the metal, and subsequently allowing the metal to solidify. Furthermore, the connection terminals 31 comprises so-called under bump metallurgy elements 21 for improving the electrical connection between the interposer device 4 and the IC 3. The nanostructure connection bump 15 may become somewhat concave on its outer surface as shown in FIG. 3. This is achieved via proper ratio between the amount of metal 29 relative to the number or amount of nanostructures 25 so that the metal 29 can not escape from the nanostructure connection bump 15. However, a convex outer surface would not compromise the function of the nanostructure connection bump 15, although a concave surface is preferred. In addition, there is a layer of insulating material 20 on the IC 3 overlapping somewhat with the under bump metallurgy elements 21 to prevent short circuits on the assembly substrate 11. Note that the gap between the insulating layer 20 and the assembly substrate 11 is for illustration purposes and in practice there will be no gap.

Figure 4A:
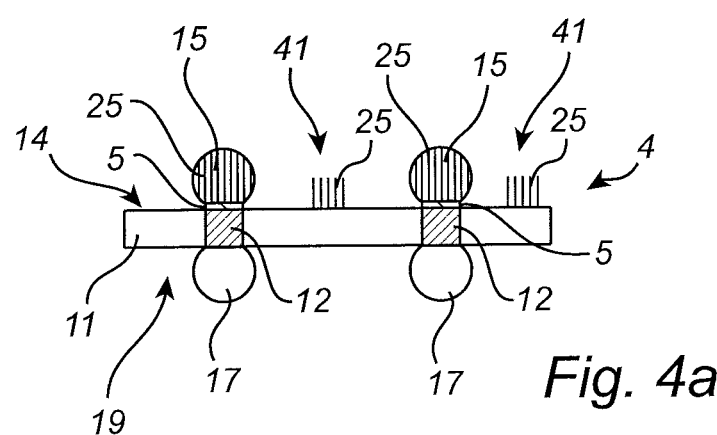

Referring to FIG. 4a, there is schematically shown a further embodiment of the invention. In FIG. 4 there is shown an assembly platform 4 which differs from the assembly platform 4 in FIG. 2a in that there is second plurality 41 of elongated nanostructures vertically grown on the first side 14 of the assembly substrate 11. The second plurality of elongated nanostructures may be carbon nanostructures grown directly on the assembly substrate 11 or they may be grown on electrodes (not shown). The second plurality of elongated nanostructures 25 may further be metallic nanotubes, nanowhiskers or nanowires. Furthermore, the second plurality of nanostructures 25 is not embedded in a metal. The second plurality of nanostructures 25 may serve several different purposes, for example the second plurality of nanostructures 25 may be configured to dissipate heat from the IC 3 to the assembly substrate 11, thereby improving thermal dissipation of the electronic device 1. In a second example the second plurality of nanostructures 25 are configured to mechanically support the IC 3 to thereby relieve stress on the nanostructure connection bumps 15 exerted by e.g. the IC 3. In a third example the second plurality of nanostructures 25 are configured to reduce mismatch in coefficient of thermal expansion (CTE). Thus, the nanostructures 25 flexes as a response to thermal expansion of e.g. the IC 3 substrate so that there is some degree of mismatch tolerance. The second plurality of nanostructures 25 may also serve as alignment marks or have optical functions (e.g. light absorbing black materials, frequency dependent/sensitive element). The second plurality of nanostructures may be arranged in a regular array to create structures to mimic artificial photonic crystals to function as optical interconnects or wave guides. To make a functional second plurality of nanostructures they may be designed to grown anywhere on the interposer according to embodiment design and functions. According to an embodiment of the invention, the second plurality of nanostructures may be grown surrounding the at least one nanostructure bumps. Furthermore, the second plurality of nanostructures may be grown from a recessed assembly structure.

Figure 4B:
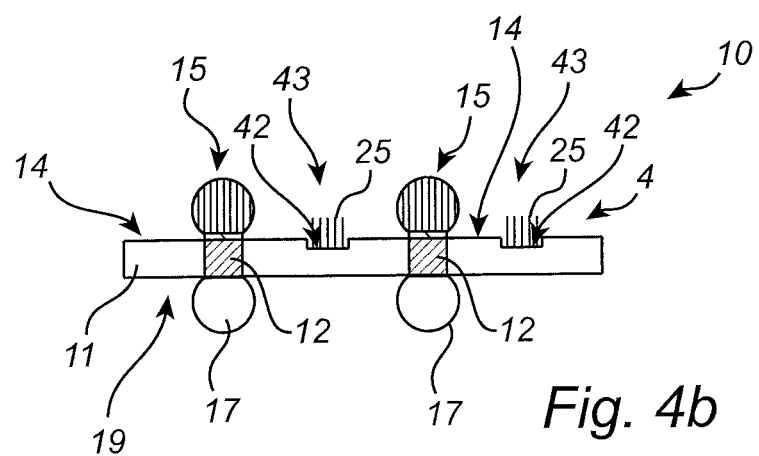

In a further embodiment schematically illustrated in FIG. 4b, the second plurality 41 of nanostructures 25 are arranged, thus has been grown, in an opening 43 in the assembly platform 11. The opening has a bottom 42 on which the second plurality of nanostructures have been vertically grown. The second plurality of nanostructures 25 extend out from the opening to above the surface of the first side 14. Thus, the second plurality of nanostructures 25 will make physical contact with e.g. an IC when it is bonded with the nanostructure connection bumps as shown in e.g. FIG. 3. This way, 25 when arranged in the opening 43, the second plurality of nanostructures can more efficiently transfer e.g. heat to the assembly substrate 11.

Figure 4C:
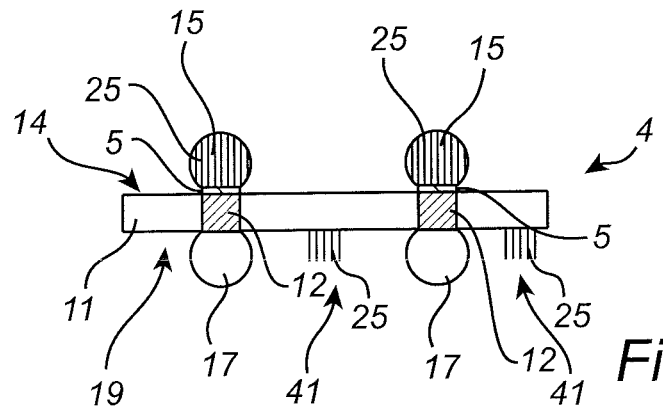
Figure 4D:
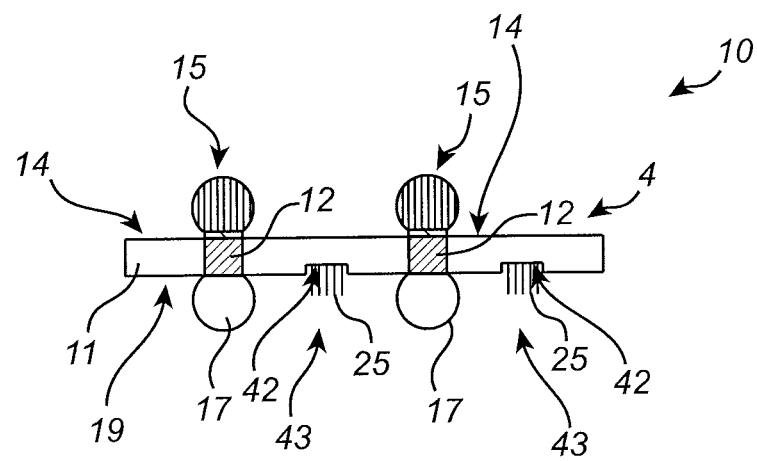
Figure 4E:
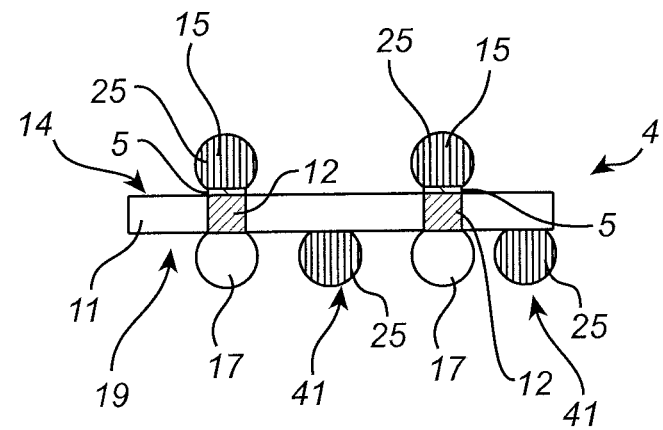

Additional embodiments are illustrated in FIG. 4c-d, in which the difference with FIGS. 4a-b is that the second plurality of nanostructures is arranged on the second side 19 of the assembly substrate 11. Additionally, and as is exemplified in FIG. 4e, the second plurality of nanostructures 41 may further also be coated with or embedded in a metal or a polymeric material. Although not shown, the coated or embedded second plurality of nanostructures may be arranged in an opening 42. The second plurality of nanostructures in FIGS. 4a-d may be grown directly on the assembly substrate 11 or on an electrode (not shown) arranged on the assembly substrate 11.

Figure 2C:
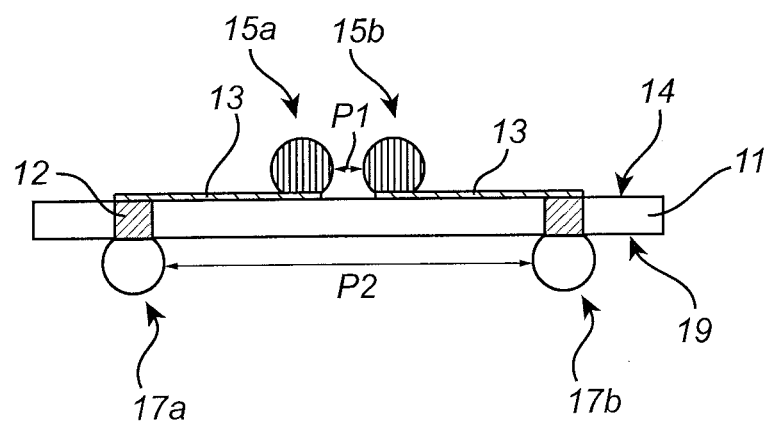

Referring again to FIG. 1 and also to FIG. 2c, in one embodiment the pitch p1 (not shown in FIG. 1) between two adjacent nanostructure connection bumps 15a and 15b on the first side 14 is different from the pitch (p2, also shown in FIG. 3 and FIG. 2c) between two adjacent connection bumps 17a and 17b on the second side 19. As also shown, the nanostructures connection bump 15a is connected to the connection bump 17a via a vias and conductive pattern 13. In a similar way, the nanostructures connection bump 15b is connected to the connection bump 17b via a vias and conductive pattern 13. This can also be described as a fan-out configuration, thus the pitch on one side of the interposer device is smaller than on the other side. In this example, the pitch (p1) on the first side 14 is smaller than the pitch (p2) on the second side 19.

Figure 5:
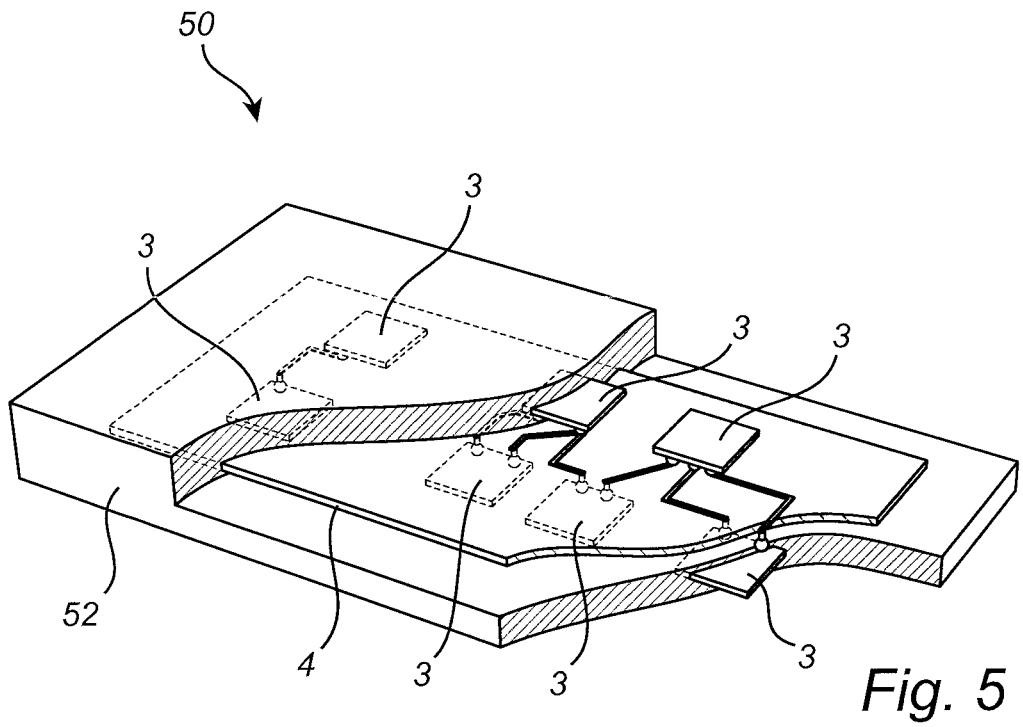
FIG. 5 schematically illustrates and electronic assembly according to an embodiment of the invention.

Referring now to FIG. 5 which schematically illustrates an electronic assembly 50 according to an embodiment of the invention. The electronic assembly 50 comprises an assembly platform 4 as previously described with reference to any one of FIGS. 1-4. In FIG. 5, the assembly platform 50 is arranged to interconnect integrated circuits 3 through vias and nanostructure bumps (not shown) as previously described. Although only seven IC's are shown here, any number of IC's may be interconnected using the assembly platform 4 as long as they fit on the assembly platform 4. In addition, the electronic assembly comprises a housing 52 in the form of an over-molded housing covering the assembly platform 4 and the IC's 3. Naturally, there are connection ports (not shown) so that the assembly platform IC's 3 can be connected from the outside of the housing 52. The housing 52 may be comprised of epoxy or a resin.

Figure 6:
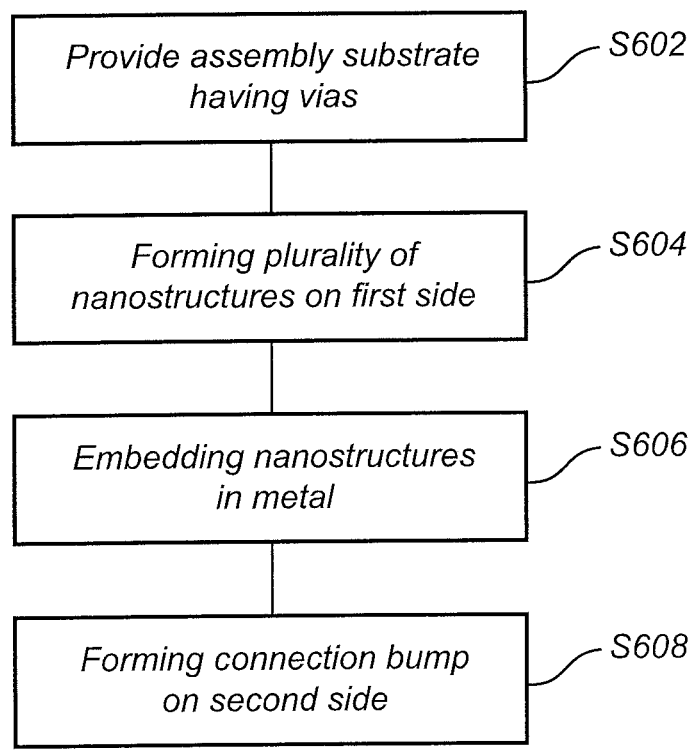
FIG. 6 is a flow-chart of method steps according to an embodiment of the invention.

FIG. 6 is a flowchart illustrating method steps for manufacturing an assembly platform according to an embodiment of the invention. In a first step S602, an assembly substrate is provided having a plurality of conducting vias extending through the assembly substrate. Subsequently S604, forming at least a first plurality of conductive elongated nanostructures on the assembly substrate. The first plurality of conductive elongated nanostructures are configured to define connection locations on the assembly platform. In step S606, embedding each nanostructure in the first plurality of conductive nanostructures in a metal, whereby the first plurality of conductive elongated nanostructures and the metal forms a nanostructure connection bump being conductively connected to the vias and defining connection locations for connection with at least one of the integrated circuit and the substrate. For enabling connections on the other side of the assembly substrate, S608, forming a connection bump comprising a metal on a second side of the assembly substrate, the second side being opposite to the first side, the connection bump being conductively connected to the vias and defining connection locations for connection with at least one of the integrated circuit and the substrate.

For example, the forming of the plurality of conductive elongated nanostructures comprises providing a patterned catalyst layer on the assembly substrate. Subsequently, growing each nanostructure in the first plurality of conductive nanostructures from the catalyst layer.

The invention provides for enabling high aspect ratio connection bumps, this is accomplished by the nanostructures being embedded in a metal. The amount of metal is such that the metal is maintained within the connection location by the plurality of elongated nanostructures 25, for example by capillary forces. As an example, the ratio between the height (h) and the width (w) may be at least 2, such as 3, 4, or 5, or larger. In addition, the height (h) of the nanostructure connection bumps 15 is controllable by controlling the growing height of the elongated nanostructures 25.

In one aspect of the present invention, the method for making one or more nanostructures includes: depositing a conducting helplayer on an upper surface of a substrate; depositing a patterned layer of catalyst on the conducting helplayer; growing the one or more nanostructures on the layer of catalyst; and selectively removing the conducting helplayer between and around the one or more nanostructures. In some implementations, the layer of catalyst is patterned after it is deposited. In some implementations, the substrate additionally comprises a metal underlayer, co-extensive with its upper surface, and which is covered by the conducting helplayer. In some implementations, the metal underlayer is patterned. In some implementations, the metal underlayer comprises one or more metals selected from: Cu, Ti, W, Mo, Pt, Al, Au, Pd, P, Ni, and Fe. In some implementations, the metal underlayer comprises one or more conducting alloys selected from: TiC, TiN, WN, and AlN. In some implementations, the metal underlayer comprises silicdes e.g. NiSi, MoSi, WSi etc.,In some implementations, the metal underlayer comprises one or more conducting polymers.

The technology described herein can be utilized with a numberof different materials as the helplayer. It is important to select helplayer materials and etching parameters so that the nanostructures can be used as a self-aligned mask layer during the etching of the helplayer. The choice of the helplayer material can depend on the material lying beneath the help layer.

The helplayer can also be a catalyst, as the selective removal process can also be used to remove any unwanted catalyst residuals between the grown nanostructures.

The catalyst can be nickel, iron, platinum, palladium, nickel-siliCide, cobalt, molybdenum, Au or alloys thereof, or can be combined with other materials (e.g., silicon). The catalyst can be optional, as the technology described herein can also be applied in a catalyst-free growth process for nanostructures. Catalyst can also be deposited through spin coating of catalyst particles.

In some implementations, any of the depositing is carried out by a method selected from: evaporating, plating, sputtering, molecular beam epitaxy, pulsed laser depositing, CVD, ALD and spin-coating. In some implementations, the one or more nanostructures comprises carbon, GaAs, ZnO, InP, InGaAs, GaN, InGaN, or Si. In some implementations, the one or more nanostructures include nanofibers, nanotubes, or nanowires. In some implementations, the conducting helplayer comprises a material selected from: a semiconductor, a conducting polymer, and an alloy. In some implementations, the conducting helplayer is from 1 nm to 100 microns thick. In some implementations, the one or more nanostructures are grown in a plasma. In some implementations, the one or more nanostructures are carbide derived carbon. In some implementations, the selective removal of the conducting helplayer is accomplished by etching. In some implementations, the etching is plasma dry etching. In some implementations, the etching is an electrochemical etching. In some implementations, the etching is photo chemical pyrolysis etching. In some implementations, the etching is pyrolysis etching. In some implementations, the method further includes depositing an additional layer between the conducting help layer and the layer of catalyst.

According to an aspect, growing a plurality of nanostructures was carried out using the method comprising: depositing a catalyst layer on the electrodes, the catalyst layer comprising grains having a average grain size different from the average grain size of the electrodes, thereby forming a stack of layers comprising the bottom layer and the catalyst layer; heating the stack of layers to a temperature where nanostructures can form and providing a gas comprising a reactant such that the reactant comes into contact with the catalyst layer.

In some implementation, chlorination process is used to derive carbon nanostructures from metal carbide layer e.g. forming carbon nanostructures from TiC, SiC or any other carbide precursors.

Figure 7:
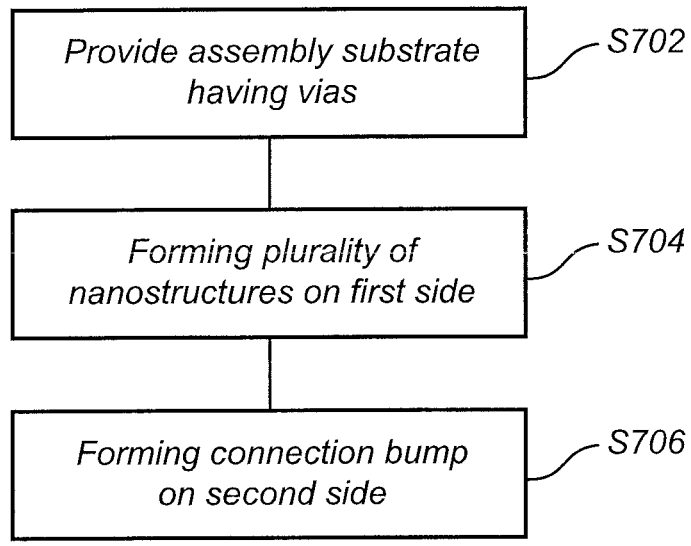
FIG. 7 is a flow-chart of method steps according to an embodiment of the invention.

FIG. 7 is a flowchart illustrating method steps for manufacturing an assembly platform for arrangement between an integrated circuit and a substrate or a second integrated circuit to interconnect the first integrated circuit and the substrate (or the second integrated circuit) through the assembly platform, according to an embodiment of the invention. In a first step S702, an assembly substrate is provided having a plurality of conducting vias extending through the assembly substrate. Subsequently S704, forming at least a first plurality of conductive elongated nanostructures on the assembly substrate. The first plurality of conductive elongated nanostructures is configured to define connection locations on the assembly platform. For enabling connections on the other side of the assembly substrate, S706, forming a connection bump comprising a metal on a second side of the assembly substrate, the second side being opposite to the first side, the connection bump being conductively connected to the vias and defining connection locations for connection with at least one of the integrated circuit and the substrate.

Figure 8:
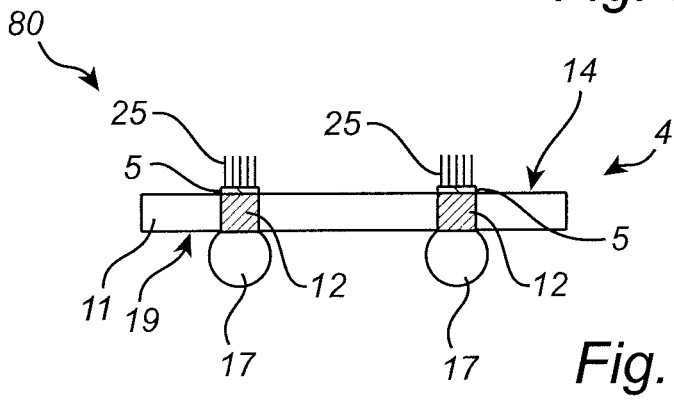
FIG. 8 schematically illustrates an exemplary assembly platform.

FIG. 8 shows a cross section of an assembly platform 80 for arrangement as an interposer device between an integrated circuit 3 and a substrate 2 to interconnect the integrated circuit 3 and the substrate 2 through the assembly platform. In this embodiment, the assembly platform 80 comprises an assembly substrate 11 and a plurality of conducting vias 12 extending through the assembly substrate 11. There is further shown at least one nanostructure 25 on a first side 14 of the assembly substrate 11. The plurality of nanostructures 25 will form a nanostructure connection bump 15 comprising the metal embedding the nanostructures at the time of assembly with the integrated circuit (see e.g. FIG. 9a). The nanostructure connection bump 15 is conductively connected to the vias 12 and defining connection locations for connection with at least one of the integrated circuit 3 and the substrate 2. The plurality of elongated conductive nanostructures 25 are vertically grown on the first side 14 of the assembly substrate 11 for the connection with at least one of the integrated circuit 3 and the substrate 2. There is further a electrode 5 connected to each nanostructure 25 in the first plurality of nanostructures and connected to the vias 12. On the second side 19 of the assembly substrate there is at least one connection bump 17. The second side being opposite to the first side and the connection bump 17 is conductively connected to the vias 12 and defining connection locations for connection with at least one of the integrated circuit 3 and the substrate 2.

Figure 9A:
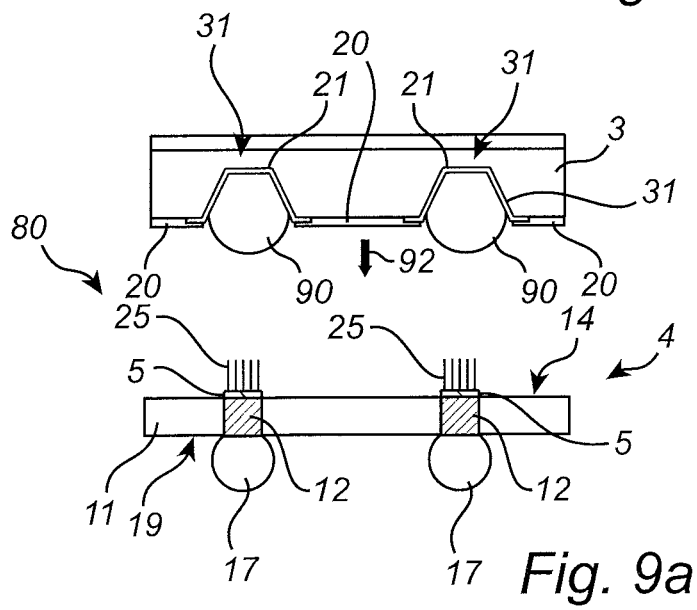
FIG. 9a schematically illustrates assembling an assembly platform with an integrated circuit or a substrate.

Referring to FIG. 9a, there is schematically shown an assembly platform 4 to be assembled with an IC 3. The assembly platform is in this example the one shown in FIG. 8. The IC 3 comprises connection terminals 31 to which the nanostructures are connected by applying heat or pressure to the metal bumps 90 arranaed in the connection terminals 31 to liquefy the metal, and thereafter making contact between the metal bumps 90 and the nanostructures 25 as indicated by the arrow 92, and subsequently allowing the metal 90 to solidify. Furthermore, the connection terminals 31 comprises so-called under bump metallurgy elements 21 for improving the electrical connection between the interposer device 4 and the IC 3.

Figure 9B:
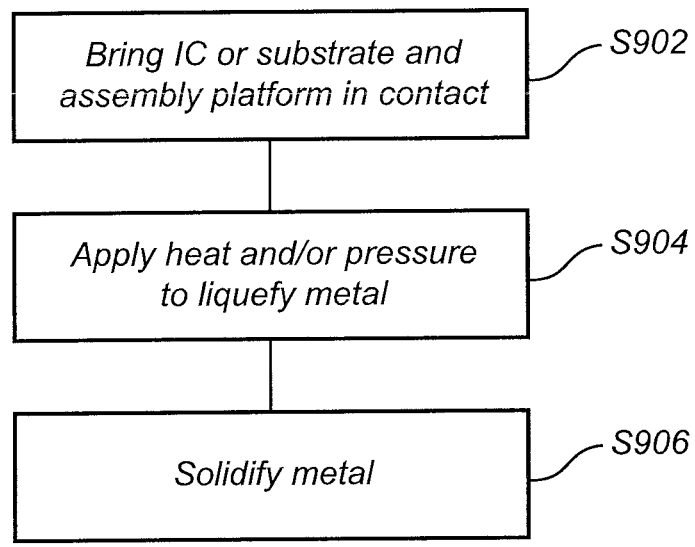
FIG. 9b is a flow-chart of method steps according to an embodiment of the invention.

FIG. 9b shows a flow-chart with steps for connecting an IC or a substrate with an assembly platform. For example, the IC and the assembly platform may be the ones described with reference to FIG. 3 or the ones described with reference to FIG. 9a. In a first step, the IC or the substrate is brought into contact with the assembly platform, either with the nanostructure connection bump (e.g. FIG. 3) or so that the metal bump 90 is in contact with the nanostructures 25 (FIG. 9a). Next, heat and/or pressure or suitable combination thereof is applied to liquefy the metal, either the metal bumps 90 (FIG. 9a) or the metal 29 embedding the nanostructures 25 (e.g. FIG. 3). Subsequently, the metal is allowed to solidify. In some embodiment, the metal may be liquefied before bringing the IC or the substrate is into contact with the assembly platform.

Figure 10:
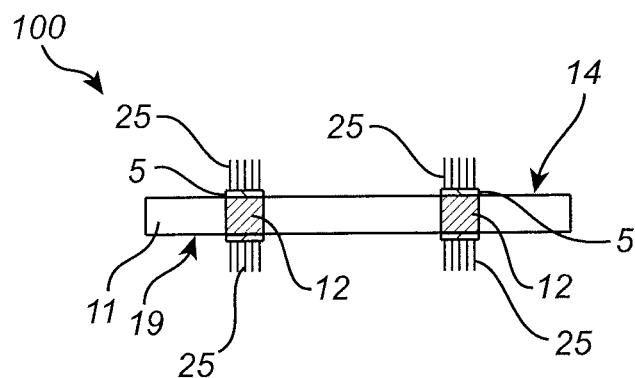
FIG. 10 schematically illustrates an exemplary assembly platform.

FIG. 10 schematically illustrates a cross-section of another assembly platform 100 for arrangement as an interposer device between an integrated circuit 3 and a substrate 2 to interconnect the integrated circuit 3 and the substrate 2 through the assembly platform. In this embodiment, the assembly platform 100 comprises an assembly substrate 11 and a plurality of conducting vias 12 extending through the assembly substrate 11. There is further shown at least one nanostructure 25 on a first side 14 of the assembly substrate 11. The nanostructures are conductively connected to the vias 12 and defining connection locations for connection with at least one of the integrated circuit 3 and the substrate 2. The elongated conductive nanostructures 25 are vertically grown on the first side 14 of the assembly substrate 11 for the connection with at least one of the integrated circuit 3 and the substrate 2. The plurality of nanostructures 25 will form a nanostructure connection bump comprising the metal embedding the nanostructures at the time of assembly with the integrated circuit (see e.g. FIG. 9a). There is further a electrode 5 connected to each nanostructure 25 in the first plurality of nanostructures and connected to the vias 12. On the second side 19 of the assembly substrate there is a further plurality of elongated conductive nanostructures 25. In this assembly platform, the elongated conductive nanostructures 25 are not embedded in metal. The electrode 5 may be part of a conductive pattern 13 (see e.g. FIG. 1).

With the method described herein, it is possible to manufacture individual nanostructures, arrays of nanostructures or "forests" of nanostructures.

Figure 11A:
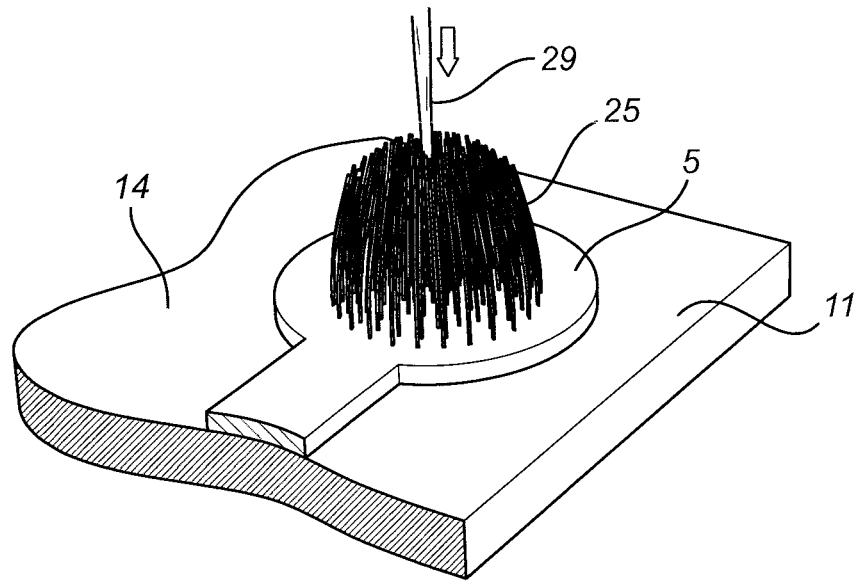
FIG. 11a-b conceptually illustrates the forming of a nanostructure connection bump.
Figure 11B:
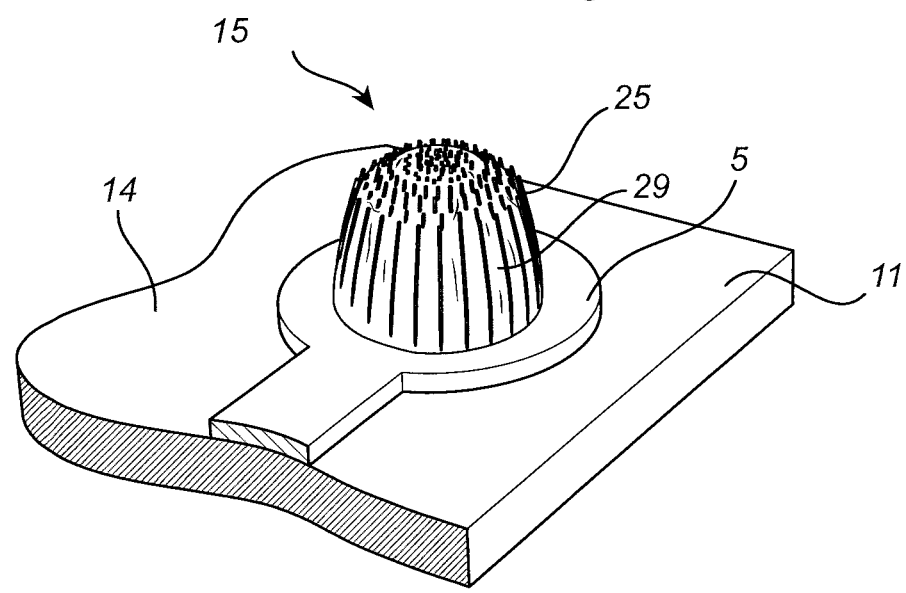

FIG. 11b conceptually illustrates a nanostructure connection bump 15 comprising a plurality of elongated conductive nanostructures 25 vertically grown on the first side 14 of an assembly substrate 11. The nanostructures have been grown on an electrode 5 in this case although the nanostructures may also be grown on the conductive pattern 13 (see FIG. 1) in which case the electrode is part of the conductive pattern. In some embodiments the nanostructures may have been grown on another electrode which may be dummy electrode (for example in cases where the nanostructures are used for mechanical support) or an electrode on the second side 19 of the assembly platform 100 (see FIG. 10). FIG. 11a conceptually illustrates the plurality of nanostructures 25 which have been grown on the first side 14 of the assembly substrate 11. The plurality of elongated nanostructures 25 are configured to be embedded in a metal for said connection with at least one of said integrated circuit and said substrate. Metal 29 is provided to the plurality of nanostructures 25 in liquid state or is liquefied on the nanostructures 25. The amount of metal 29 in the liquid state for forming the nanostructure connection bump 15 is such that the plurality of nanostructures 25 maintains the liquid metal within the connection location by capillary forces caused by the plurality of elongated nanostructures 25. The liquid metal solidifies within the connection location defined by the electrode 5 such that a nanostructure connection bump 15 is formed as shown in FIG. 11b.

"Nanostructure" is a structure that has at least one dimension in the order of nanometers.

Nanostructures can include nanofibers, nanotubes or nanowires of carbon, GaAs, ZnO, InP, GaN, InGaN, InGaAs, Si, or other materials. Nanostructure may also be formed by deriving nanostructure from alloys e.g. carbide derived carbon from TiC.

The vias may be made from any suitable conductive material known in the art, for example, Au, Al, Cu, Tungsten, Silicide, Ni, Mo, etc. In some cases, vias may be surrounded by additional materials as diffusion barriers.

The assembly platform substrate may be an interposer. The interposer may be based on solid state materials for example comprising Silicon, glass, poly-silicon, AAO (anodized aluminum oxide), alumina, sapphire, SiGe, SiC. The interposer may be based on soft not rigid materials e.g. polymer, epoxy, laminate, flex etc. Interposer may have different thermal expansion of coefficient depending on the type of materials it is made of. The interposer may be made of a composite material that include anisotropic conducting materials. For example, Cu-AAO, nanostructures-AAO composite, nanostructures-polymer, Cu-polymer or any other suitable materials combinations thereof. The interposer may be coated with insulating layer for example, $SiO_2$, SiN where appropriate. The interposer may be oxidized to form $SiO_2$, SiN etc. Solid state interposers may be rigid, not flexible and brittle. Interposer may contain flat surfaces or corrugated surfaces. The interposer may comprise of at least one metal layer as interconnect redistribution layer (RDL). Multiples of interposer layers maybe envisaged to be assembled to create the total assembly platform. Interposer materials are essentially having lower electrical conductivity than the vias so that the electrical current may flow only through the vias.

The assembly substrate may for example comprise Silicon, a polymer, glass, poly-silicon, epoxy, SiC, etc.

The assembly platform is envisaged to assemble heterogeneous die assembly possibilities where different die are manufactured utilizing different non compatible technology platforms.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

What is claimed is:

1. An assembly platform for arrangement as an interposer device between an integrated circuit and a substrate to interconnect the integrated circuit and said substrate through said assembly platform, said assembly platform comprising:

an assembly substrate;
a plurality of conducting vias extending through said assembly substrate;
at least one nanostructure connection bump on a first side of said assembly substrate, each nanostructure connection bump being conductively connected to at least one of said vias and defining a connection location for connection with at least one of said integrated circuit and said substrate, wherein each of said nanostructure connection bumps comprises:
a plurality of elongated conductive nanostructures vertically grown on said first side of said assembly substrate, wherein said plurality of elongated nanostructures are embedded in a metal for said connection with at least one of said integrated circuit and said substrate,
a electrode connected to each nanostructure in said first plurality of nanostructures and connected to said vias; and
at least one connection bump on a second side of said assembly substrate, the second side being opposite to the first side, said connection bump being conductively connected to said vias and defining connection locations for connection with at least one of said integrated circuit and said substrate.

2. The assembly platform according to claim 1, further comprising a conductor pattern on said assembly substrate, said conductor pattern being conductively connected to the at least one vias and connecting the nanostructure connection bump to the at least one vias so that the nanostructure connection bump is electrically connected to the connection bump on the second side of the assembly substrate.

3. The assembly platform according to claim 1, wherein said conductive nanostructures are metallic or carbon nanostructures.

4. The assembly platform according to claim 1, wherein the plurality of elongated nanostructures of said nanostructure connection bump and the amount of metal is configured so that the metal is maintained within the connection location by said plurality of elongated nanostructures.

5. The assembly platform according to claim 1, wherein the plurality of elongated nanostructures of said nanostructure connection bump are densely arranged such that the metal when in a liquid state is maintained within the connection location by capillary forces caused by said plurality of elongated nanostructures.

6. The assembly platform according to claim 1, wherein the pitch between two adjacent nanostructure connection bumps on said first side is different from the pitch between two adjacent connection bumps on said second side, each of the two nanostructure connection bumps on said first side are connected to a respective adjacent connection bump on said second side through a respective vias.

7. The assembly platform according to claim 6, wherein the pitch between two adjacent nanostructure connection bumps on said first side is smaller than the pitch between two adjacent connection bumps on said second side.

8. The assembly platform according to claim 1, wherein said at least one connection bump on the second side of said assembly substrate is/are nanostructure connection bump(s).

9. The assembly platform according to claim 1, wherein the height of said nanostructure connection bump is controllable by the growing height of said elongated conductive nano structures.

10. The assembly platform according to claim 1, further comprising a second plurality of elongated nanostructures vertically grown on said first side of said assembly substrate.

11. The assembly platform according to claim 10, wherein the second plurality of nanostructures are grown in an opening in said assembly structure, whereby the second plurality of nanostructures extend from a bottom part of said opening to above the surface of the first side of the assembly substrate.

12. The assembly platform according to claim 10, wherein said second plurality of nanostructures is embedded in metal.

13. The assembly platform according to claim 1, further comprising a second plurality of elongated nanostructures vertically grown on said second side of said assembly substrate.

14. The assembly platform according to claim 13, wherein the second plurality of nanostructures are grown in an opening in said assembly structure, whereby the second plurality of nanostructures extend from a bottom part of said opening to above the surface of the second side of the assembly substrate.

15. An electronic assembly comprising an assembly platform according to claim 1, and further comprising said integrated circuit and said substrate, wherein said integrated circuit and said substrate are interconnected through said assembly platform.

16. The electronic assembly according to claim 15, further comprising a protective plastic housing, wherein said assembly platform, said integrated circuit and said substrate is over-molded by said housing.

17. An assembly platform for arrangement as an interposer device between an integrated circuit and a substrate to interconnect the integrated circuit and said substrate through said assembly platform, said assembly platform comprising:
an assembly substrate;
a plurality of conducting vias extending through said assembly substrate;
at least one nanostructure connection bump on a first side of said assembly substrate, each nanostructure connection bump being conductively connected to at least one of said vias and defining a connection location for connection with at least one of said integrated circuit and said substrate, wherein each of said nanostructure connection bumps comprises:
a plurality of elongated conductive nanostructures vertically grown on said first side of said assembly substrate, wherein said plurality of elongated nanostructures are configured to be embedded in a metal for said connection with at least one of said integrated circuit and said substrate,
an electrode connected to each nanostructure in said first plurality of nanostructures and connected to said vias; and
at least one connection bump on a second side of said assembly substrate, the second side being opposite to the first side, said connection bump being conductively connected to said vias and defining connection locations for connection with at least one of said integrated circuit and said substrate.

18. The assembly platform according to claim 17, further comprising a conductor pattern on said assembly substrate, said conductor pattern being conductively connected to the at least one vias and connecting the nanostructure connection bump to the at least one vias so that the nanostructure connection bump is electrically connected to the connection bump on the second side of the assembly substrate.

19. The assembly platform according to claim 17, wherein said conductive nanostructures are metallic or carbon nanostructures.

20. The assembly platform according to claim 17, wherein the plurality of elongated nanostructures of said nanostructure connection bump is configured so that a predetermined amount of said metal is maintained within the connection location by said plurality of elongated nanostructures.

21. The assembly platform according to claim 17, wherein the plurality of elongated nanostructures of said nanostructure connection bump are densely arranged such that the metal when in a liquid state is maintained within the connection location by capillary forces caused by said plurality of elongated nanostructures.

22. The assembly platform according to claim 17, wherein the pitch between two adjacent nanostructure connection bumps on said first side is different from the pitch between two adjacent connection bumps on said second side, each of the two nanostructure connection bumps on said first side are connected to a respective adjacent connection bump on said second side through a respective vias.

23. The assembly platform according to claim 22, wherein the pitch between two adjacent nanostructure connection bumps on said first side is smaller than the pitch between two adjacent connection bumps on said second side.

24. The assembly platform according to claim 17, wherein said at least one connection bump on the second side of said assembly substrate is/are nanostructure connection bump(s).

25. The assembly platform according to claim 17, wherein the height of said nanostructure connection bump is controllable by the growing height of said elongated conductive nano structures.

26. The assembly platform according to claim 17, further comprising a second plurality of elongated nanostructures vertically grown on said first side of said assembly substrate.

27. The assembly platform according to claim 26, wherein the second plurality of nanostructures are grown in an opening in said assembly structure, whereby the second plurality of nanostructures extend from a bottom part of said opening to above the surface of the first side of the assembly substrate.

28. The assembly platform according to claim 26, wherein said second plurality of nanostructures is embedded in metal.

29. The assembly platform according to claim 17, further comprising a second plurality of elongated nanostructures vertically grown on said second side of said assembly substrate.

30. The assembly platform according to claim 29, wherein the second plurality of nanostructures are grown in an opening in said assembly structure, whereby the second plurality of nanostructures extend from a bottom part of said opening to above the surface of the second side of the assembly substrate.

* * * * *